United States Patent [19]

Silverstein et al.

[11] Patent Number: 4,982,150

[45] Date of Patent: Jan. 1, 1991

[54] SPECTRAL ESTIMATION UTILIZING AN AUTOCORRELATION-BASED MINIMUM FREE ENERGY METHOD

[75] Inventors: Seth D. Silverstein; Joseph M. Pimbley, both of Schenectady, N.Y.

[73] Assignee: General Electric Company, Schenectady, N.Y.

[21] Appl. No.: 428,810

[22] Filed: Oct. 30, 1989

[51] Int. Cl.$^5$ ............................................. G01R 23/16
[52] U.S. Cl. .................................................. 324/77 G
[58] Field of Search ......................... 364/724.03; 375/1; 324/77 R, 77 B, 77 A, 77 D, 77 E, 77 G, 77 H, 78 R, 79 R

[56] References Cited

U.S. PATENT DOCUMENTS 3,824,384  7/1974  Murata et al. ................. 364/724.03
4,761,796  8/1988  Dunn et al. ............................ 375/1

Primary Examiner—Michael J. Tokar
Attorney, Agent, or Firm—Marvin Snyder; James C. Davis, Jr.

[57] ABSTRACT

A method for rapidly estimating power spectral density components in the spectrum of an input signal, by digitizing the input signal over a selected time interval at a selected sample rate; and estimating an autocorrelation sequence for the digitized input signal before generating a solution $b_s^0$ to the autocorrelation sequence in a Yule-Walker equation by use of Levinson recursion. After generating a control parameter (temperature) $\alpha$, a non-linear MFE equation, $$\sum_{s=0}^{p} b_s r[k-s] = \delta_{k,0} - \frac{\alpha}{b_0} \sum_{m,s} \frac{b_m b_s b_{m+s-k}^*}{g_{k-s}}$$

is solved with $b_s^0$ as an initial solution. Then, power spectral density components $$p(f) = \frac{1}{b_0} \left| \sum_{s=0}^{} b_s e^{-j2\pi fs} \right|^2$$

are generated and recorded as estimates of the input signal.

10 Claims, 11 Drawing Sheets

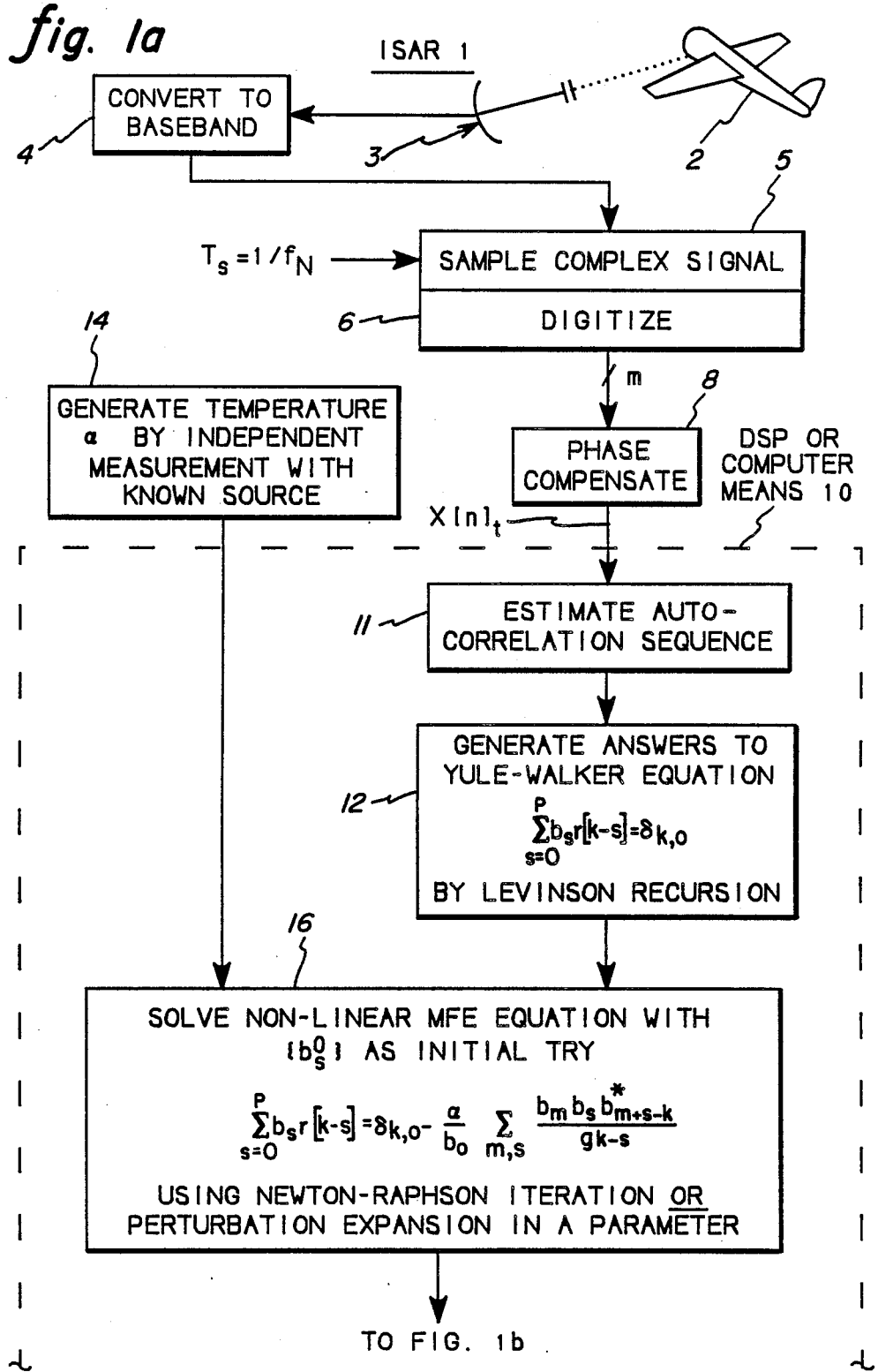

SPECTRAL ESTIMATION UTILIZING AN AUTOCORRELATION-BASED MINIMUM FREE ENERGY METHOD

BACKGROUND OF THE INVENTION

The present invention relates to spectral estimation of non-deterministic signals and, more particularly, to a more robust method for estimating spectral components of incomplete and/or noisy input signal records.

It is known to utilize a maximum entropy method for estimation of spectral components of a signal, as originally discussed by J. P. Burg in "Maximum Entropy Spectral Analysis", *Proc. 37th Meeting Society Exploration Geophysicist* (1967), but such spectral estimators exhibit severe degradation from either noisy or short input data records if autoregressive (AR) or autoregressive-moving-average (ARMA) estimation models are utilized. Because spectral estimation methods are useful in a variety of technical applications, including voice recognition, voice and image compression Doppler velocimetry, moving target indication and/or target-bearing estimation (in radar and sonar systems) high resolution spectroscopy for qualitative and quantitative chemical analysis, and the like, it is highly desirable to have a robust spectrum estimation method which can operate even when the incoming sample signaled data records fluctuate due to incompleteness and/or noise. The use of a constrained maximum entropy approach, where a Lagrange multiplier in the constrained extremal value problem can be interpreted as an effective temperature parameter, is known from the work of S. J. Wernecke and L. R. D'Addario, "Maximum Entropy Image Reconstruction", *IEEE Trans. Comput.*, vol C-26, pp 351–364 (1977); S. F. Gull and G. J. Daniell, "Image Reconstruction From Incomplete and Noisy Data," *Nature*, vol. 272, pp. 686–690 (1978); and T. J. Cornwell, "A Method of Stabilizing The CLEAN Algorithm," *Astron. Astrophys.*, vol. 121, pp. 281–285, (1983) wherein two-dimensional spatial-spectral super-resolution radio-astronomy imagery was considered using data generated from large aperture synthesis techniques. In these works, the solution to the state variables were generated either by Newton-Raphson iterative solutions, or by the deployment of a non-linear deconvolution algorithm (with the acronym "CLEAN" as originally introduced by J. Högbom, in "Aperture Synthesis With a Non-Regular Distribution of Interferometer Baselines," *Astrophys. J. Suppl.*, vol. 15, pp. 417–426, 1974. However, it is desirable to provide a method having not only greater accuracy, but shorter implementation time than either the Newton-Raphson or CLEAN algorithmic solution methods utilized in this prior art.

BRIEF SUMMARY OF THE INVENTION

In accordance with the invention, a method for rapidly estimating power spectral density components $\rho(f)$ in the spectrum of an input signal, includes the steps of: digitizing the input signal over a selected time interval at a selected sample rate; estimating an autocorrelation sequence for the digitized input signal; generating solutions $\{b_s^0\}$ to the autocorrelation sequence in a Yule-Walker equation by use of Levinson recursion; generating a control parameter (temperature) $\alpha$; solving a non-linear MFE equation, $$\sum_{s=0}^{p} b_s r[k-s] = \delta_{k,0} - \frac{\alpha}{b_0} \sum_{m,s} \frac{b_m b_s b_{m+s-k}^*}{g_{k-s}}$$

with $\{b_s^0\}$ as an initial solution generating power spectral density components $\rho(f)$ $$\rho(f) = \frac{1}{b_0} \left| \sum_{s=0} b_s e^{-j2\pi fs} \right|^2 ;$$

and recording the generated components $\rho(f)$ as estimates of the input signal.

In one presently preferred embodiment, the input signal is the processed received return signal in an ISAR radar unit, and the estimated spectral components are compared with known signatures to determine what form of target is returning the echos.

Accordingly, it is an object of the present invention to provide a method for rapidly estimating the spectral components of a signal.

This and other objects of the present invention will be understood by those skilled in this art, upon reading of the following detailed description, when considered in conjunction with the drawings.

BRIEF DESCRIPTION OF THE FIGURES

FIGS. 1a and 1b are flow diagrams of the method of the present invention, as applied in a radar system;

DETAILED DESCRIPTION OF THE INVENTION

Figure 1B:
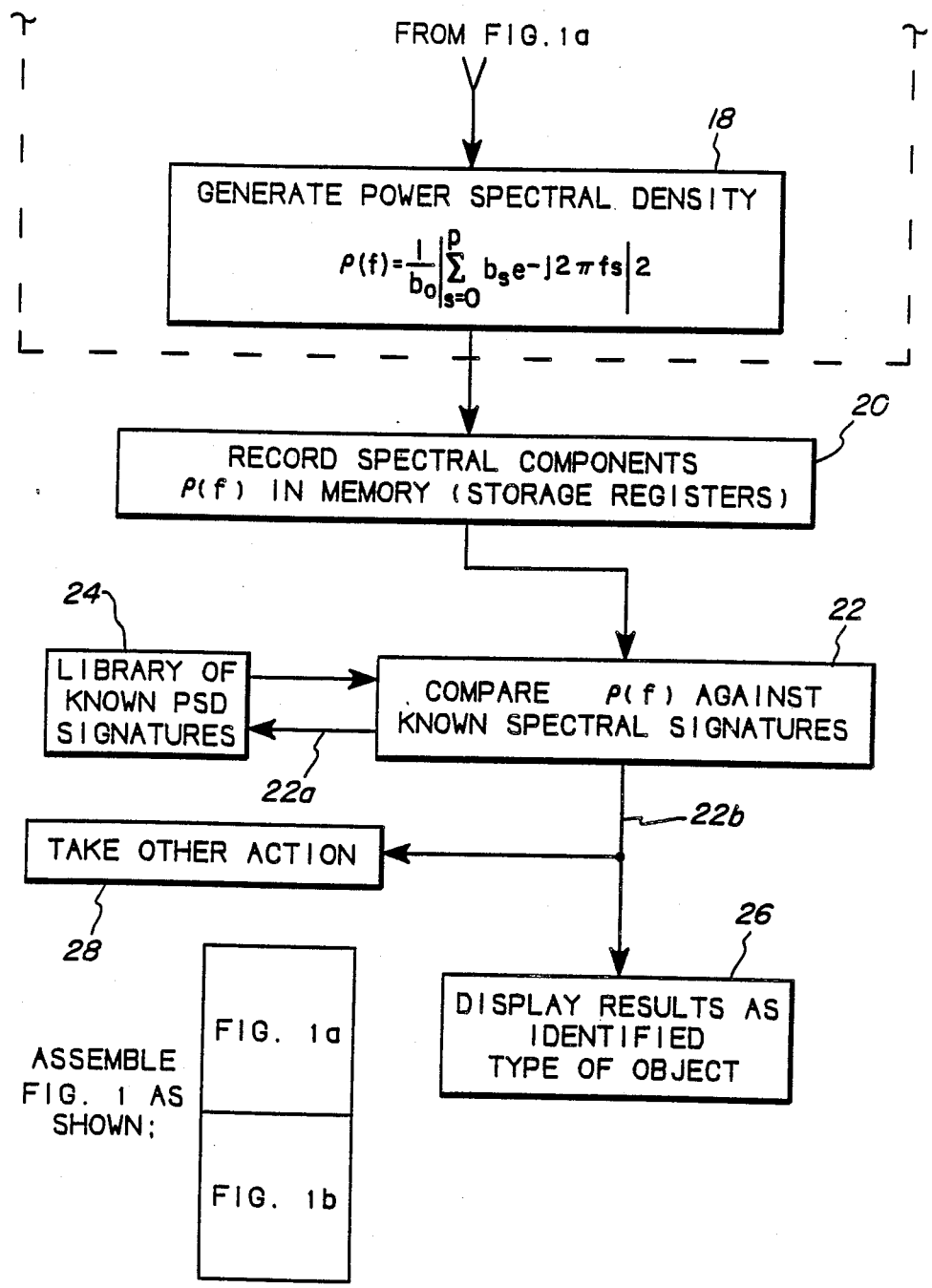

Our minimum-free-energy (MFE) parametric estimation method is based upon the obtaining of a global minimum of an appropriately-defined free energy function (FEF). A direct analogy can be made here with thermodynamic science and the MFE free energy objective function can be taken as a linear combination of error energy and signal entropy in the system. The negative coefficient of the entropy term in the free energy expression is established by us as an effective signal processing temperature, $\alpha$. If viewed from a cost function perspective, the addition of a negative measure of entropy, with a strength controlled by a control parameter $\alpha$ (which we will interpret as an effective signal processing temperature in analogy with thermodynamics) serves to reduce the net cost for solutions which have greater a priori probability of existence as measured by their smoothness. Thus, MFE is a generic method which can be formulated in many different ways, i.e. a different formulation can be provided for each different one of a variety of estimation applications. It will be seen that in the limit of low contamination (that is, with a correspondence to a limit of zero effective temperature) our minimum free energy method provides answers which reduce identically to the minimum mean squared error counterpart.

It is important to understand that optimal values of the temperature control parameter $\alpha$ are tied both to the contamination level of the input data (its signal-to-noise ratio) and to the order of the parametric model used. We have found, and our simulations indicate, that precise values of the control parameter $\alpha$ are not at all critical. Instead, it appears that our MFE method operates well within relatively broad tolerance ranges to extract the signal spectra represented in a stream of sampled data obtained from a complex input signal. Thus, in analysis of real systems, the range of the temperature, or control, parameter $\alpha$ can be calibrated with a known source.

The minimum-free-energy method described herein is based upon an autocorrelation sequence (ACS) approach to the global minimization problem, and therefore is referred to, in full, as a MFE-ACS method.

THE MATHEMATICAL VIEW OF THE MFE-ACS METHOD

In our MFE-ACS method, we define an error energy U which is a sum of the absolute square of the difference between the initial estimated values of the autocorrelation sequence (ACS), which can also be viewed as the "dirty" terms thereof, and the final ACS estimated values, which can be considered as the "clean" ACS terms. We prefer that our MFE-ACS method utilize an unbiased initial estimate of the autocorrelation sequence. Thus, the error energy U is defined as the window-weighted mean-square difference between the initial (dirty) and final (clean) ACS estimates, or $$U = \tfrac{1}{2} \sum_{m=-\infty}^{\infty} g_m |r_d[m] - r_c[m]|^2. \quad (1)$$

where the r[m] terms represent the normalized elements of the autocorrelation sequence, i.e. $r[m] = R[m]/R[0]$. It will be seen that the subscript d and c are used to represent the "dirty" and "clean" terms, respectively, in referring to the initial and final estimates of both the autocorrelation sequence and the subsequent power spectral density function $\rho(f)$. The normalized power spectral density $\rho(f)$ and the normalized autocorrelation sequence form Fourier transform pairs. For simplicity, we will use a rectangular window so that, for a p-th order model, the gain function $g_m = 1$ for $|mp \leq |$ and $g_m = 0$ otherwise. Note here that all discrete times are in units of the uniform sampling period $T_s$ and all frequencies are in units of the Nyquist frequency, $f_N = 1/T_s$. The Shannon/Burg entropy measure H is defined, within an arbitrary constant, by $$H = \int_{-\tfrac{1}{2}}^{+\tfrac{1}{2}} \log[\rho_c(f)] df. \quad (2)$$

A free energy function, $F = U - \alpha H$, is then minimized with respect to variations in the predicted power spectral density $\rho(f)$. In this process, the control parameter $\alpha$ is analogous to kT in physical systems and, accordingly, represents the effective temperature parameter in the MFE-ACS analysis. The mathematical results give a standard form for the cleaned power spectral density $\rho c(f)$ in terms of the product of conjugate polynominals, that is $$\rho_c(f) = \frac{\beta}{A^*(f)A(f)} \quad (3)$$

where $\beta$ is a constant proportional to the energy of the signal and is always normalized, and the functions $A^*(f)$ and A(f) are conjugate polynomials of order p in the variables and this polynomial can be expressed in terms of the autoregressive coefficients, by the form, $$A(f) = \sum_{k=0}^{p} a_k e^{-j2\pi fk}, a_0 = 1. \quad (4)$$

In the MFE-ACS method, these conjugate polynomials have been specifically chosen so that the A(f)s are minimum phase polynomials. Accordingly, A(f) has all of its zeros in the upper half of the complex f plane; it will be understood that upper half f plane transforms into the interior of the unit circle in the z plane. Thus, the MFE-ACS equation for the coefficient reduces to a non-linear extension of the Yule-Walker equation for the model coefficient, with $$\sum_{s=0}^{p} b_s r[k-s] = \delta_{k,0} - \frac{\alpha}{b_0} \sum_{m,s}^{p} \frac{b_m b_s b_{m+s-k}}{g_{k-s}} \quad (5)$$

We constrain the sums in the above equation so that coefficients which do not fall within the index boundaries are set to zero, i.e. so that $b_y = 0$ if $y < 0$ or $y > p$. In our simulation studies, numerical solutions to the non-linear MFE-ACS equation are obtained utilizing Newton-Raphson iteration, in manner comparable to that of the original Burg algorithm. We have also found that solution can be accomplished using perturbation expansion in a selected parameter. We have also found that it is important to realize that the non-linear MFE-ACS process can also be formulated as a minimum free energy extension of the modified covariance spectral estimation algorithm. The main difference, in this implementation, is that the Toeplitz autocorrelation matrix in the MFE-ACS equation (5) must be replaced by the data correlation matrix which is Hermitian, but not Toeplitz. The MFE extension of the modified covariance method is very effective in replicating line-spectral sources at relatively high levels of noise.

EXAMPLES

For example, images can be generated utilizing a MFE spectral processor as a high-performance subsystem in an inverse synthetic aperture radar (ISAR) imaging system 1. In this case, a radar image can be generated under conditions which do not allow a standard optical or visual image to be obtained. Thus, images can be obtained at night time, in all weather even though normally precluded by cloud cover and at ranges extended beyond the normal optical range. Since radar aircraft images are an important means of aircraft identification, whether used for civil or military recognizance, such radar signals, at extended ranges are highly desirable. Thus, an aircraft 2 provides an echo to a radio-frequency processing chain 3, which RF echo is then demodulated down to baseband by a converter 4. The baseband signal is sampled in unit 5 and digitized in unit 6, before being phase compensated in unit 8 and provided as the sampled complex signal $X[n]_t$ to the MFE spatial spectrum estimator 10, which can use an appropriately programmed general digital computer or digital signal processor (DSP) means. The MFE process is particularly suited to this application because the radar echo signals are modeled well as a series of point sources which arise from specific glint scatterers on the aircraft surface. In ISAR the motion of the object to be imaged is used synthetically to generate the radar aperture, while the transmitter-receiver system is usually kept fixed. Thus, one can gain physical insight into the ISAR process by viewing the system through the eyes of an observer sitting on the target to be imaged. To this observer, the transmitter/receiver system appears to be moving at the velocity $-v_t$ while emitting a series of N coherent pulses at a uniform pulse repetition rate $1/T_p$. To the observer, the ISAR signals are indistinguishable from similar signals which would be generated from a fixed linear-phased array. The fixed array, in such an example, would have to be oriented in the direction of the relative philosophy, have a length $Nv_tT_p$, with element spacing $v_tT_p$, and be operated in a sequential firing mode.

Such a system suffers from image aberration problems arising from sampled aperture systems when the object is not in the far field of the aperture. This is analogous to the experience almost everyone has had with photographs, where the images are distorted because of improper focussing. Out-of-focus blurring effects occur when the optical system transfer function does not properly compensate for the near-field terms in the phase of the scattered signals. The phase compensation necessary for focussing can usually be achieved by adjusting the lens position relative to the focal plane, along the optical axis. For relatively narrow band (temporal frequency) sources, the mathematical structure for image generation in the far-field of a uniformly sampled coherent aperture is identical to the mathematics of estimating the frequency spectrum of a uniformly-sampled coherent time series. A phase compensated near-field spatial imaging problem will therefore be reduced to the canonical structural form of a uniformly-sampled time-series. Therefore, images can be generated using either Fourier-based spectral estimation algorithms, such as the periodogram and the like, or by alternatively using one of the super-resolution matrix-based algorithms. The MFE method is particularly suited to this task, as it performs well for a source model of the type characterized by the radar echoes. Therefore, the resulting image will have finer resolution, at a lower signal-to-noise ratio, then would be otherwise usable or obtainable with hitherto, known methods.

In a first simulation study, a relatively simple simulation event was utilized with very high signal-to-noise ratios, in order to isolate incomplete/short data record effects. The complex input signal $X[n]_t$ consists of four complex sinusoids, with frequencies, given in terms of the Nyquist frequency $f_N$, as $f_1 = -0.30\ f_N$, $f_2 = -0.10\ f_N$, $f_3 = +0.30\ f_N$ and $f_4 = +0.32\ f_N$. Utilizing a sampled aperture consisting of 32 samples, which corresponds to a Rayleigh resolution (in Nyquist frequency units) of $1/32 = 0.031$, we will recover the four spectral components, including the two positive frequency components which have a spectral separation of only about 0.62 of the Rayleigh resolution. Initially, the total signal is taken as a combination of the source signal plus additional random noise (which we model as complex Gaussian white noise) and, in the example illustrated, provide all four signal components with the same complex amplitude. The processor means first performs step 11, wherein the auto-correlation sequence ACS for this complex signal is estimated. The ACS is used to form a Yule-Walker equation, which is solved by Levinson recursion in step 12. In step 14, the control, or temperature, $\alpha$ parameter is generated, as by independent measurement with a known source, and the result fed, along with the Yule-Walker solution of step 12, into step 16.

Figure 2A:
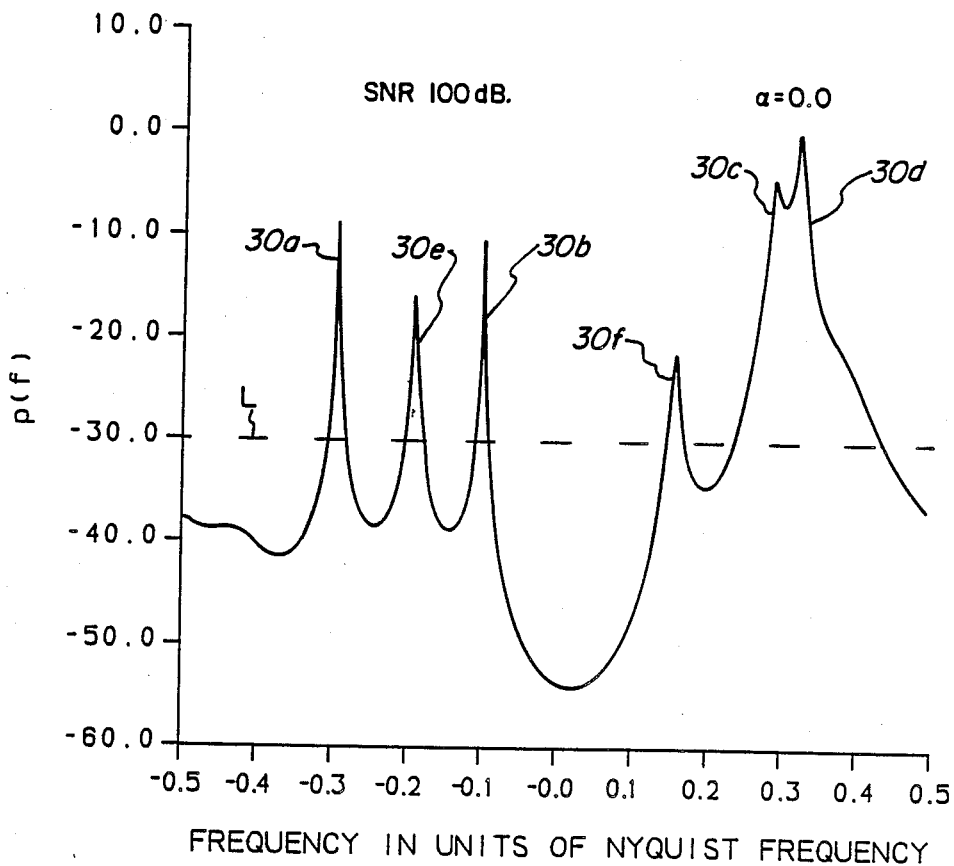
FIGS. 2a, 2b, 2c, 2d, 2e, 2f are graphs illustrating simulation results of a first input with several different temperature $\alpha$ choices, using the method of the present invention.
Figure 2B:
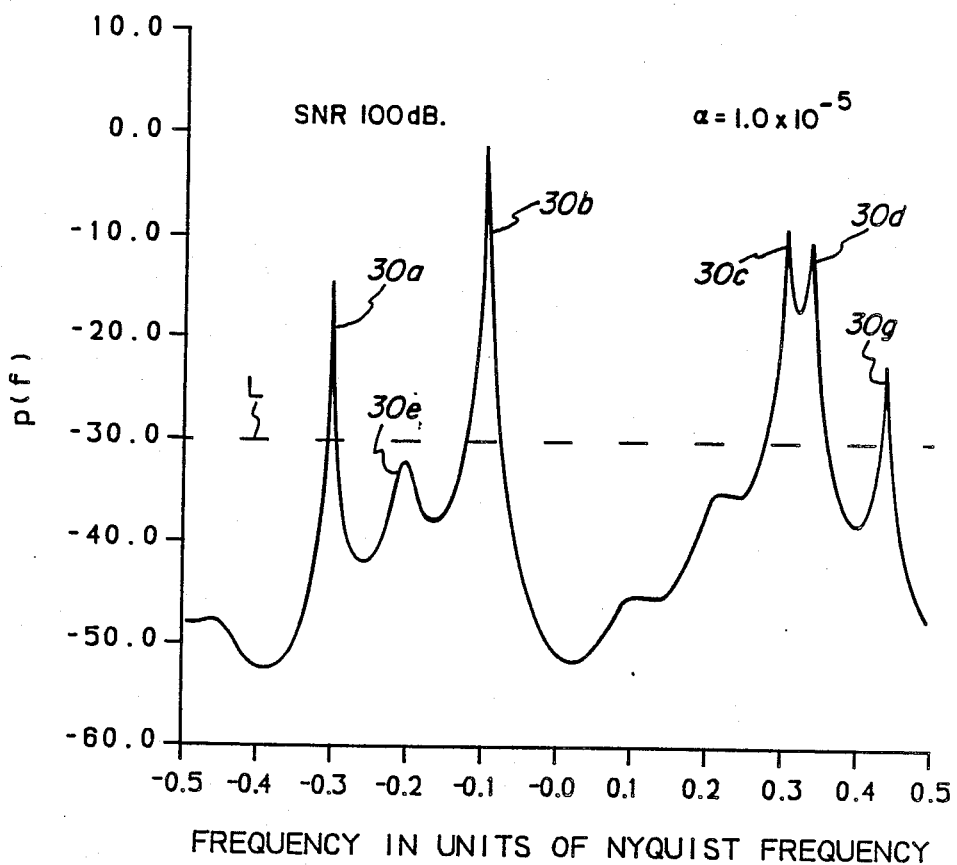
Figure 2C:
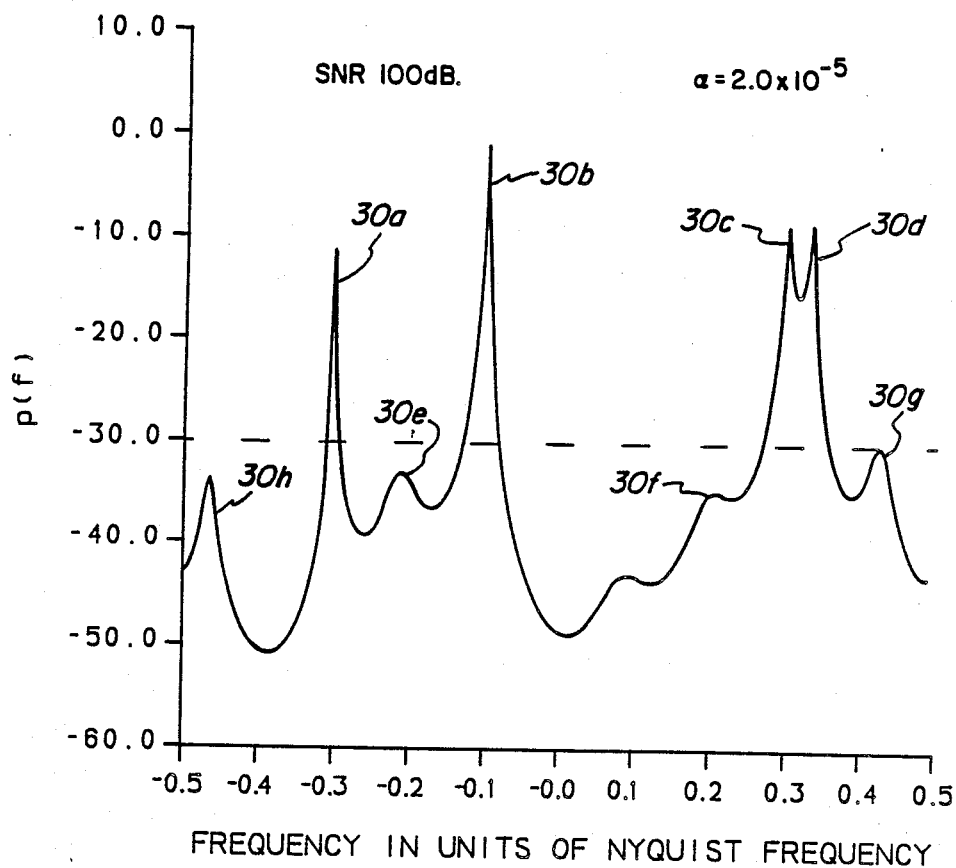
Figure 2D:
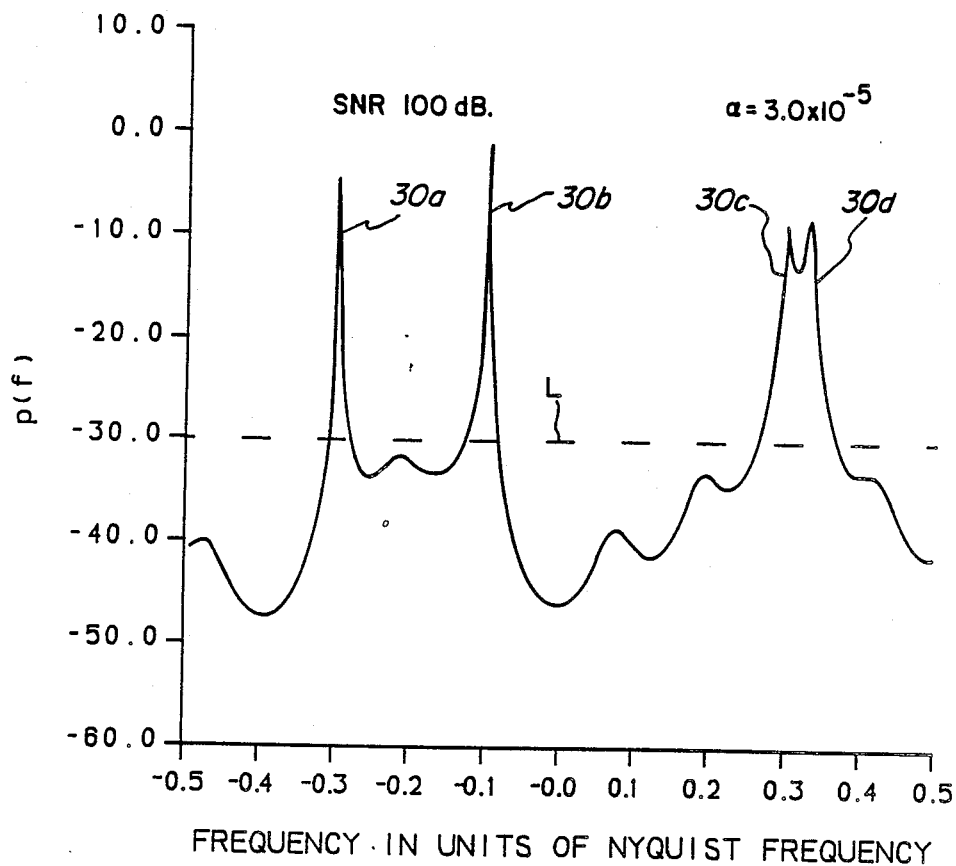
Figure 2E:
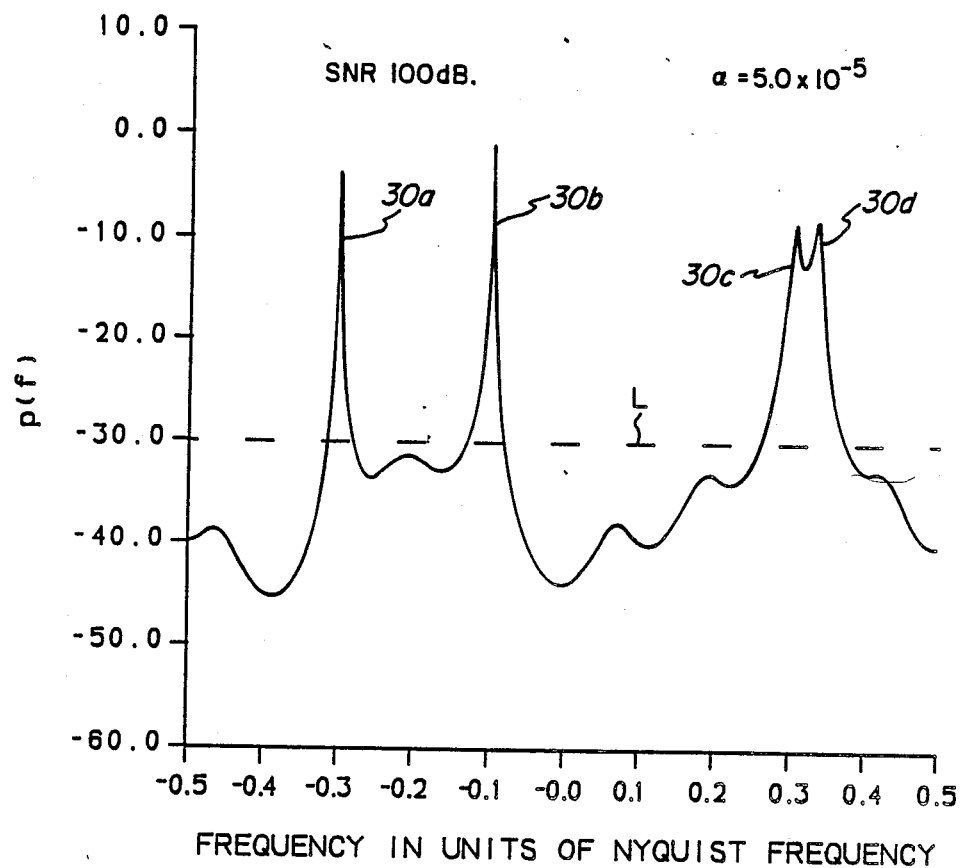
Figure 2F:
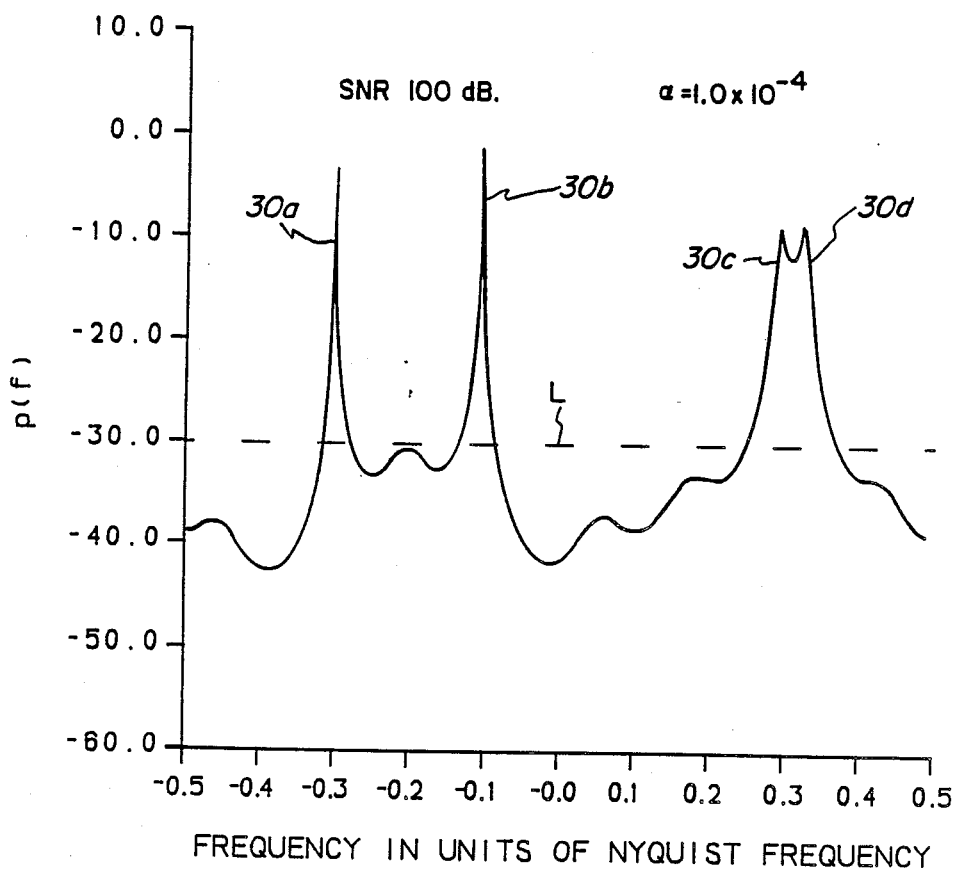

There, the non-linear MFE equation is solved, utilizing an initial guess for the constant $b_S{}^0$. The solution can be done either by Newton-Raphson iteration, or by perturbation expansion of a selected parameter. Having obtained a solution, the power spectral density $\rho(f)$ of the various spatial frequencies is generated in step 18, and then in step 20, the estimated spectral component results are recorded, by storage in assigned data registers. The stored spectral component estimates can now be utilized, as by display in step 26 on a CRT and the like, or by utilization within the system (e.g. to recognize the aircraft type, by comparison of spectral components in step 22 to a known spectral library 24) and the like other known uses (such as in step 28) of recovered echo data. It will be seen, by reference to FIG. 2a, that the original complex signal data, as received (and therefore with $\alpha=0$), contains 6 spectral peaks $30a$-$30f$, while FIGS. $2b$-$2f$ illustrate that, by choosing the parameter $\alpha$ to be above a threshold (here, $\alpha \geq 2\times 10^{-5}$) only the desired 4 spectral peaks $30a$-$30d$ are present above some preselected level L (here, $-30$ db).

In another simulation, a time signal phantom was provided with two complex sinusoids at frequency $f_1 = +0.10\ f_N$ and $f_2 = +0.012f_N$, in terms of the Nyquist $f_N$. Similar Complex amplitudes were set for both sinusoids, to imply that the two emitters always have the same relative phase at time $t=0$. In order to evaluate the effects of additive random noise, complex Gaussian white noise was added in control amounts to the phantom source signals. The data records $X[n]_t$ for these simulations consist of single snapshots of 25 uniformly-spaced time samples, as would correspond to a Rayleigh frequency resolution, in Nyquist units, of $1/25$. Spectral separation of the two closely-spaced positive frequencies $f_1$ and $f_2$ is $\frac{1}{2}$ 2 of the Raleigh resolution, in the phantom test signal. The signal-to-noise ratio of the total signal is defined in terms of the ratio of the total energy in the signal and noise bands; at low signal-to-noise ratios, performance is best judged by repetitive Monte-Carlo simulations, where statistical properties of the spectral output of the method of study. We investigated the behavior of a series of independent snapshot/-trials, where the additive noise is uncorrelated for the different trials. If the statistics do not appreciably vary from small to a large number of trials, then one can safely conclude that low trial number results should prove reliable in analyzing contaminated spectra.

Figure 3A:
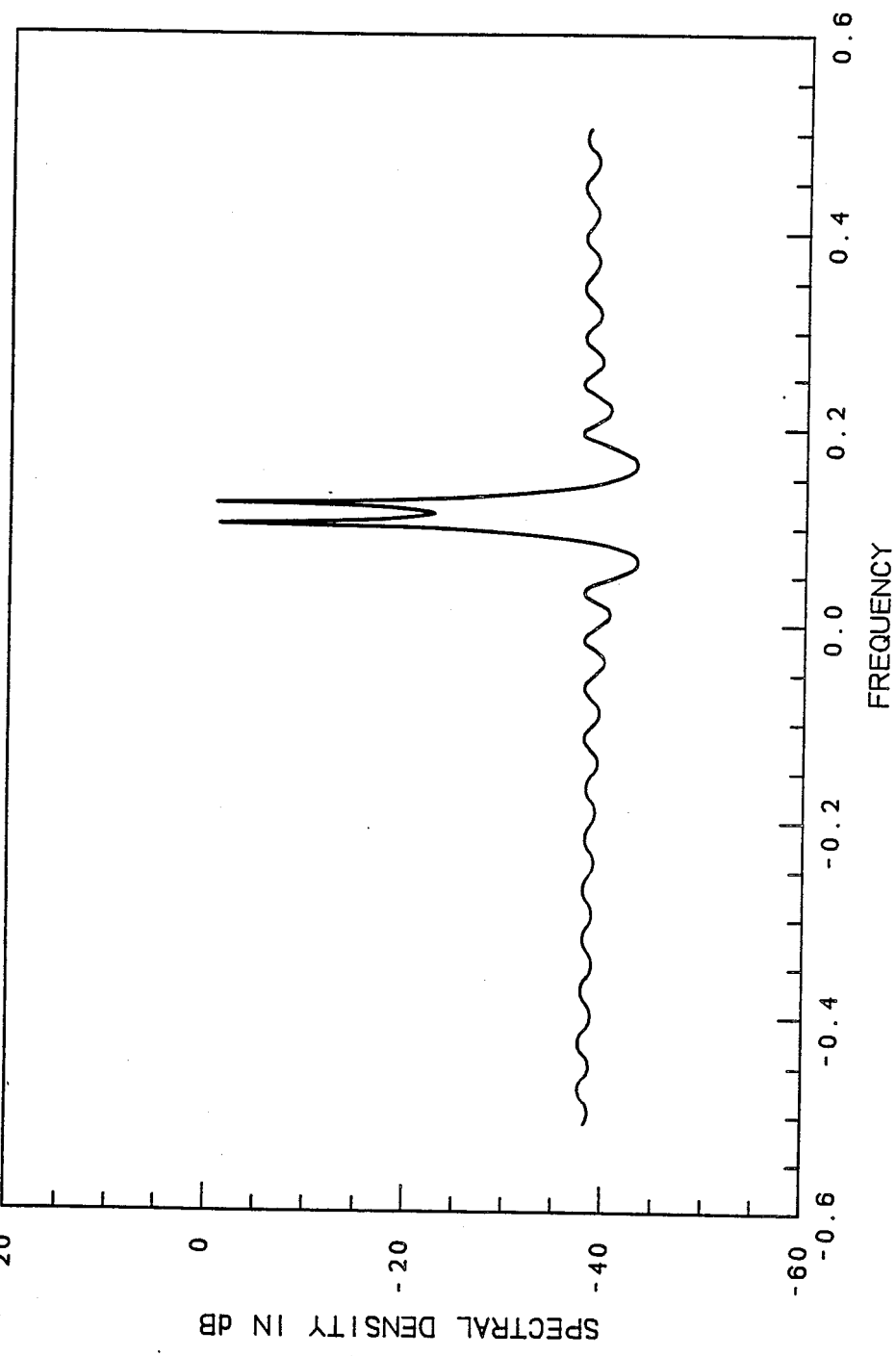
FIGS. 3a, 3b and 3c are graphs illustrating the simulation results of the method of the present invention operating upon another input signal.
Figure 3B:
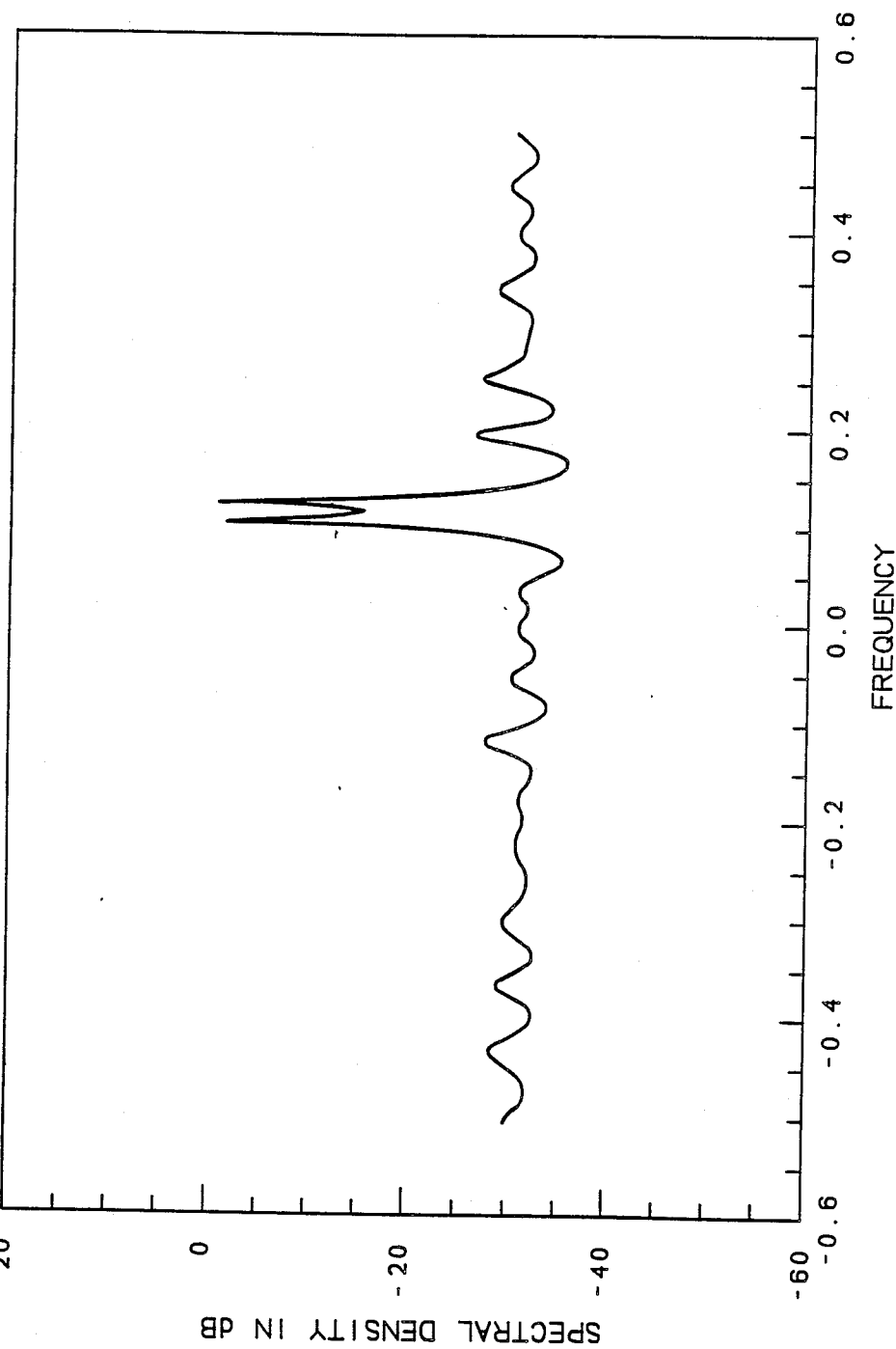
Figure 3C:
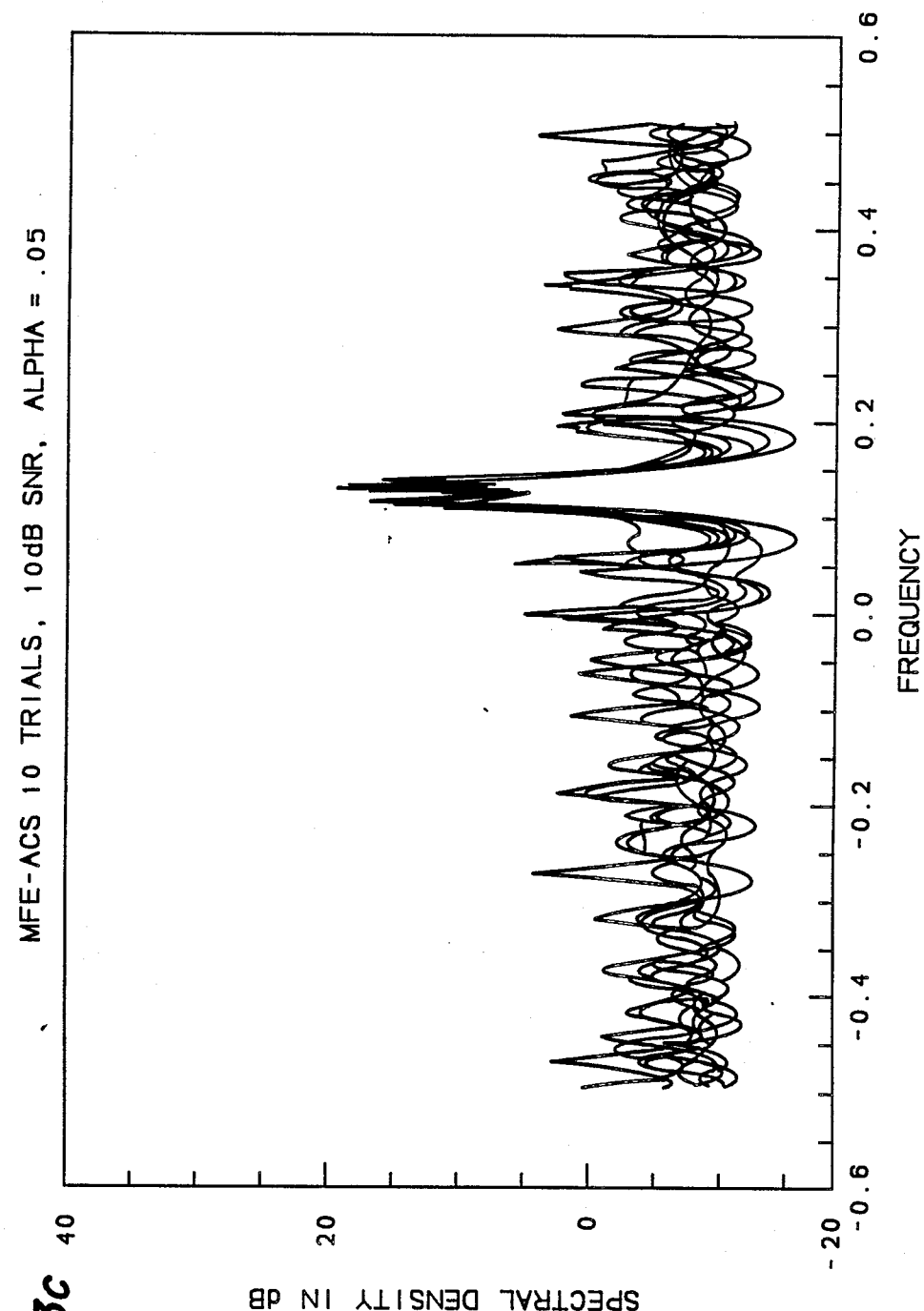

In FIG. 3a, the MFE-ACS results are illustrated for a signal-to-noise ratio of 60 decibels, with a simulated temperature $\alpha=0.001$; the two estimated components $40a$ and $40b$ are clearly seen. These results are seen to be markedly superior to conventional maximum entropy solutions, which, moreover, are usually not stable for high-noise spectra. Referring to FIG. 3b, another markedly-superior result is obtained with only 20 decibels of signal-to-noise ratio, and the use of $\alpha=0.02$. Finally, FIG. 3c illustrates an overlay plot of 10 different random noise trials using the MFE-ACS method at only 10 decibel signal-to-noise ratio, with a fixed temperature set at $\alpha=0.05$; the closely-spaced pair of spectral estimates $40a$ and $40b$ b are still clearly apparent. It will therefore be seen that the minimum free energy method performs well over relatively broad range of the control parameter (effective signal processing temperature) $\alpha$. Thus, one would be able to choose a value of $\alpha$ based upon a typical known spectrum, calibrated with the signal measuring system and utilize such a value of $\alpha$ determined from off-line calibration, to suffice for unknown spectra to be estimated by our MFE-ACS process.

While several presently preferred embodiments of our novel invention have been described in detail herein, many modifications and variations will now become apparent to those skilled in the art. It is our intent, therefore, to be limited only by the scope of the appending claims and not by the specific details and instrumentalities presented by way of explanation herein.

What we claim is:

1. A method for rapidly estimating power spectral density components $\rho(t)$ in the spectrum of an input signal $x(t)$, comprising the steps of:
   (a) digitizing the input signal, with a selected sample rate, to provide a sampled input signal $X[n]_t$;
   (b) estimating an autocorrelation sequence (ACS) for the sampled input signal $X[n]_t$;
   (c) generating a solution $b_s^0$ of the ACS in a Yule-Walker equation, by use of Levinson recursion;
   (d) generating a control parameter $\alpha$;
   (e) using the parameter $b_s^0$ as an initial solution, solving a non-linear MFE equation, of the form $$\sum_{s=0}^{p} b_s r[k-s] = \delta_{k,0} - \frac{\alpha}{b_0} \sum_{m,s} \frac{b_m b_s b_{m+s-k}^*}{g_{k-s}} ;$$

(f) generating power spectral density components $$\rho(f) = \frac{1}{b_0} \left| \sum_{s=0}^{\infty} b_s e^{-j2\pi fs} \right|^2 ;$$

(g) recording the spectral components $\rho(f)$ thus generated as estimates of the input signal.

2. The method of claim 1, wherein step (e) includes the step of solving the non-linear MFE equation using Newton-Raphson iteration.

3. The method of claim 1, wherein step (e) includes the step of solving the non-linear MFE equation by using perturbation expansion of a selected parameter.

4. A method for rapidly estimating power spectral density components $\rho(f)$ in the spectrum of an input signal $x(t)$, comprising the steps of:
   (a) digitizing the input signal, with a selected sample rate, to provide a sampled input signal $X[n]_t$;
   (b) estimating an autocorrelation sequence (ACS) for the sampled input signal $X[n]_t$;
   (c) obtaining an error energy U from the ACS;
   (d) generating a control parameter $\alpha$;
   (e) minimizing a free-energy function $F = U - \alpha H$, where $$H = \int_{-\frac{1}{2}}^{+\frac{1}{2}} \log[\rho_c(f)] df,$$

proportional to signal energy and the functions $A^*(f)$ and $dA(f)$ conjugate polynomials of order p in variables $e^{\pm j2\pi f}$; (f) solving a non-linear MFE equation, of the form $$\sum_{s=0}^{p} b_s r[k-s] = \delta_{k,0} - \frac{\alpha}{b_0} \sum_{m,s} \frac{b_m b_s b_{m+s-k}^*}{g_{k-s}} ;$$

(g) generating power spectral density components $$\rho(f) = \frac{1}{b_0} \left| \sum_{s=0}^{\infty} b_s e^{-j2\pi fs} \right|^2 ;$$

and
   (h) recording the spectral components $\rho(f)$ thus generated as estimates of the input signal.

5. The method of claim 4, wherein step (c) includes the step of setting error energy U to be a sum of the absolute square of a difference between initial noisy values of the ACS and cleaned final ACS values.

6. The method of claim 5, wherein, $$U = \frac{1}{2} \sum_{m=-\infty}^{\infty} g_m |r_d[m] - r_c[m]|^2$$

$r[m]$ are the normalized elements $R[m]/R[0]$ of the ACS and $g_m$ is a preselected gain function.

7. The method of claim 6, wherein the gain function is a windowing function.

8. The method of claim 7, wherein the windowing function is rectangular.

9. The method of claim 4, wherein step (e) includes the step of solving the non-linear MFE equation using Newton-Raphson iteration.

10. The method of claim 4, wherein step (e) includes the step of solving the non-linear MFE equation by using perturbation expansion of a selected parameter.

* * * * *

UNITED STATES PATENT AND TRADEMARK OFFICE
CERTIFICATE OF CORRECTION

PATENT NO. : 4,982,150

DATED : January 1, 1991

INVENTOR(S) : Seth D. Silverstein and Joseph M. Pimbley

It is certified that error appears in the above-identified patent and that said Letters Patent is hereby corrected as shown below:

In the abstract, delete the final equation and substitute therefor $$-- \rho(f) = \frac{1}{b_0} \left| \sum_{s=0}^{p} b_s e^{-j2\pi f_s} \right|^2 --$$

In column 2 after line 6, column 7 after line 30, and column 8 after line 19, delete the equation and substitute therefor $$-- \rho(f) = \frac{1}{b_0} \left| \sum_{s=0}^{p} b_s e^{-j2\pi f_s} \right|^2 --$$

In column 3, delete equation (2) and substitute therefor $$-- H = \int_{-\frac{1}{2}}^{+\frac{1}{2}} \log[\rho_c(f)] \, df --$$

In column 6, after line 6, delete the equation and substitute therefor $$-- H = \int_{-\frac{1}{2}}^{+\frac{1}{2}} \log[\rho_c(f)] \, df --$$

UNITED STATES PATENT AND TRADEMARK OFFICE
CERTIFICATE OF CORRECTION

PATENT NO. : 4,982,150

DATED : January 1, 1991

INVENTOR(S) : Seth D. Silverstein, et al.

It is certified that error appears in the above-identified patent and that said Letters Patent is hereby corrected as shown below:

In column 3, line 61, change "$\rho c(f)$" to -- $\rho_c(f)$ --

In column 7, line 14, change "$\rho(t)$" to -- $\rho(f)$ --

Signed and Sealed this

Fourth Day of August, 1992

Attest:

DOUGLAS B. COMER

Attesting Officer      Acting Commissioner of Patents and Trademarks